(12) United States Patent
Prejbeanu et al.

(10) Patent No.: US 9,331,268 B2
(45) Date of Patent: May 3, 2016

(54) MRAM ELEMENT HAVING IMPROVED DATA RETENTION AND LOW WRITING TEMPERATURE

(71) Applicant: CROCUS Technology SA, Grenoble (FR)

(72) Inventors: Ioan Lucian Prejbeanu, Seyssinet Pariset (FR); Bernard Dieny, Lans-en-Vercors (FR); Clarisse Ducruet, Grenoble (FR); Lucien Lombard, Grenoble (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/405,918

(22) PCT Filed: Jun. 7, 2013

(86) PCT No.: PCT/EP2013/061851
§ 371 (c)(1),
(2) Date: Dec. 5, 2014

(87) PCT Pub. No.: WO2013/182701
PCT Pub. Date: Dec. 12, 2013

(65) Prior Publication Data
US 2015/0123224 A1    May 7, 2015

(30) Foreign Application Priority Data
Jun. 8, 2012    (EP) ..................................... 12290196

(51) Int. Cl.
*H01L 29/82*    (2006.01)
*H01L 43/08*    (2006.01)
*G11C 11/16*    (2006.01)
*H01L 43/02*    (2006.01)

(52) U.S. Cl.
CPC ................ *H01L 43/08* (2013.01); *G11C 11/16* (2013.01); *G11C 11/161* (2013.01); *G11C 11/1675* (2013.01); *H01L 43/02* (2013.01)

(58) Field of Classification Search
CPC ............................. H01L 43/02; H01L 43/08
USPC .......................... 257/108, 291, 421, 422, 424
See application file for complete search history.

(56) References Cited

U.S. PATENT DOCUMENTS

| 5,959,880 A | 9/1999 | Shi et al. |
| 2010/0072524 A1 | 3/2010 | Huai et al. |
| 2011/0110151 A1 | 5/2011 | Prejbeanu |

OTHER PUBLICATIONS

International Search Report for PCT/EP2013/061851 date1 Aug. 7, 2013.
Written Opinion for PCT/EP2013/061851 dated Aug. 7, 2013.

*Primary Examiner* — Tan N Tran
(74) *Attorney, Agent, or Firm* — Pearne & Gordon LLP

(57) ABSTRACT

A thermally assisted switching MRAM element including a magnetic tunnel junction including a reference layer having a reference magnetization; a storage layer having a storage magnetization; a tunnel barrier layer included between the storage layer and the reference layer; and a storage antiferromagnetic layer exchange-coupling the storage layer such as to pin the storage magnetization at a low temperature threshold and to free it at a high temperature threshold. The antiferromagnetic layer includes: at least one first antiferromagnetic layer having a first storage blocking temperature, and at least one second antiferromagnetic layer having a second storage blocking temperature; wherein the first storage blocking temperature is below 200° C. and the second storage blocking temperature is above 250° C. The MRAM element combines better data retention compared with known MRAM elements with low writing mode operating temperature.

10 Claims, 4 Drawing Sheets

MRAM ELEMENT HAVING IMPROVED DATA RETENTION AND LOW WRITING TEMPERATURE

FIELD

The present invention concerns a thermally assisted switching MRAM element having improved data retention and low writing mode operating temperature.

DESCRIPTION OF RELATED ART

Magnetoresistive random access memory (MRAM) devices are solid state, non-volatile memory devices which make use of the tunnel magnetoresistive effect. A conventional MRAM device includes a column of first electrical wires, referred to as word lines, and a row of second electrical wires, referred to as bit lines. An array of magnetic memory cells, located at the junctions of the word lines and bit lines, is used to record data signals. A typical magnetic memory cell comprises a hard magnetic layer, a soft magnetic layer, and a non-magnetic layer sandwiched between the hard magnetic layer and the soft magnetic layer. The hard magnetic layer has a magnetization vector fixed in one direction. The orientation of the magnetization vector does not change under a magnetic field applied thereon. The soft magnetic layer has an alterable magnetization vector under a magnetic field applied thereon, that either points to the same direction, hereinafter "parallel alignment", or to the opposite direction, hereinafter "antiparallel alignment", of the magnetization vector of the hard magnetic layer. Since the resistances of the magnetic memory cell in the "parallel alignment" status and the "antiparallel alignment" status are different, the two types of alignment status can be used to record the two logical states, i.e., the "0"s or "1"s of a data bit.

In a writing operation, an electric current passes through the word line and the bit line adjacent to the memory cell. When the electric current reaches a certain threshold, a magnetic field generated by the electric current will switch the orientation of the magnetization vector of the soft magnetic layer. As a result, the magnetization vector of the hard magnetic layer and the soft magnetic layer will be changed from one type of alignment, e.g. "parallel alignment", to the other type of alignment, e.g. "antiparallel alignment", so that a data signal in form of one data bit can be recorded in the memory cell.

In MRAM structure design, lower writing power dissipation and a higher cell density are most desired. Unfortunately, a reduction of cell size, i.e. an increase in cell density, will lead to a reduction in the available energy to store the bit data. Further, the error rate increases very rapidly as the cell size scales down. However, in order to reduce the error rate, high anisotropy energy is required to overcome thermal fluctuations. Hard magnetic material has higher anisotropy energy compared with soft magnetic material, but in that case a higher writing current is required. The higher anisotropy energy results in higher writing current density, which unfortunately has the disadvantage of electro-migration.

U.S. Pat. No. 5,959,880 describes an MRAM cell achieving bi-stable switching during the write operation, and good thermal and/or temporal stability of the written data when the ferromagnetic storage layer is made of a material having high magnetocrystalline anisotropy. Writing such a MRAM cell, however, require high field currents able to switch the magnetization direction of the ferromagnetic storage layer from a stable logic state to another, resulting in high power consumption. A decrease in power consumption can be obtained by reducing the magnetocrystalline anisotropy but at the expense of thermal and temporal stability. In other words, the above conventional MRAM cells do not simultaneously fulfil low power consumption and thermal and temporal stability.

In a thermally assisted switching (TAS)-MRAM cell, the storage layer is pinned by an antiferromagnetic layer, such that the magnetization of the storage layer can be oriented only when the MRAM cell is heated at a high temperature threshold, above a critical temperature of the antiferromagnetic layer. An advantage of the TAS-MRAM cell is that a high selectivity to writing can be achieved by the selective heating of the cell to be written. Moreover, the written data can be maintained when the cell is exposed to parasite magnetic fields at ambient temperature. Another advantage is the possibility of reducing significantly the size of the cell without affecting much the writing stability (or data retention). Reduced power consumption during writing can also be achieved.

Patent application US20100072524 discloses a magnetic device comprising magnetic tunnel junction having a free ferromagnetic layer, a fixed ferromagnetic layer having a pinned magnetization and an insulator barrier layer formed between the free and fixed ferromagnetic layers. The magnetic tunnel junction further comprises a magnetic biasing layer next to and magnetically coupled to the free ferromagnetic layer to increase the coercivity of the free layer. The biasing layer can comprise two layers of two different AFM materials. The magnetic device is not written using a thermally-assisted procedure.

Patent application US20110110151 by the present application describes a TAS-MRAM cell where the ferromagnetic storage layer has magnetocrystalline anisotropy that is orthogonal to the magnetocrystalline anisotropy of the ferromagnetic reference layer.

Improving further data retention can be achieved by using an antiferromagnetic layer having a higher critical temperature. However, the high critical temperature antiferromagnetic layer requires heating the MRAM cell at higher temperature and, thus resulting in higher power consumption.

BRIEF SUMMARY

The present disclosure concerns a MRAM element comprising a magnetic tunnel junction including a reference layer having a reference magnetization; a storage layer having a storage magnetization; a tunnel barrier layer included between the storage layer and the reference layer; and a storage antiferromagnetic layer exchange-coupling the storage layer such as to pin the storage magnetization at a low temperature threshold and to free it at a high temperature threshold; the antiferromagnetic layer comprising at least one first layer having a first storage blocking temperature, and at least one second antiferromagnetic layer having a second storage blocking temperature; the first storage blocking temperature being lower than the second storage blocking temperature.

In an embodiment, the first storage blocking temperature can be below 200° C. and the second storage blocking temperature can be above 250° C.

In another embodiment, said at least one first layer can comprise a FeMn-based alloy. Said at least one second layer can comprise a Mn-based alloy. Said Mn-based alloy can be selected from IrMn, PtMn or NiMn, and preferably a NiMn alloy.

In yet another embodiment, the antiferromagnetic storage layer can comprise a plurality of the first layer and a plurality of the second layer, each of said plurality of the first antiferromagnetic layer alternating with each of said plurality of the second antiferromagnetic layers.

In yet another embodiment, the first layer can have a thickness comprised between 0.1 nm and 5 nm and the second layer can have a thickness comprised between 0.1 nm and 5 nm. Preferably, the first layer has a thickness comprised between 0.5 nm and 5 nm and the second layer has a thickness comprised between 0.5 nm and 5 nm. The antiferromagnetic storage layer can have a thickness comprised between 5 nm and 50 nm, but preferably between 5 nm and 10 nm.

In yet another embodiment, the magnetic tunnel junction can further comprise an antiferromagnetic reference layer exchange-coupling the reference layer such as to pin the reference magnetization below a reference blocking temperature of the antiferromagnetic reference layer.

The present disclosure also pertains to a MRAM device comprising a plurality of the MRAM element.

An advantage of the antiferromagnetic storage layer disclosed herein is that it combines the stability of the second antiferromagnetic layer, thus better data retention, with the low Néel temperature of the first antiferromagnetic storage layer, thus low writing mode operating temperature. Another advantage is that the storage blocking temperature of the antiferromagnetic storage layer can be tuned by varying the composition and the thickness of each of the first and second antiferromagnetic layers.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
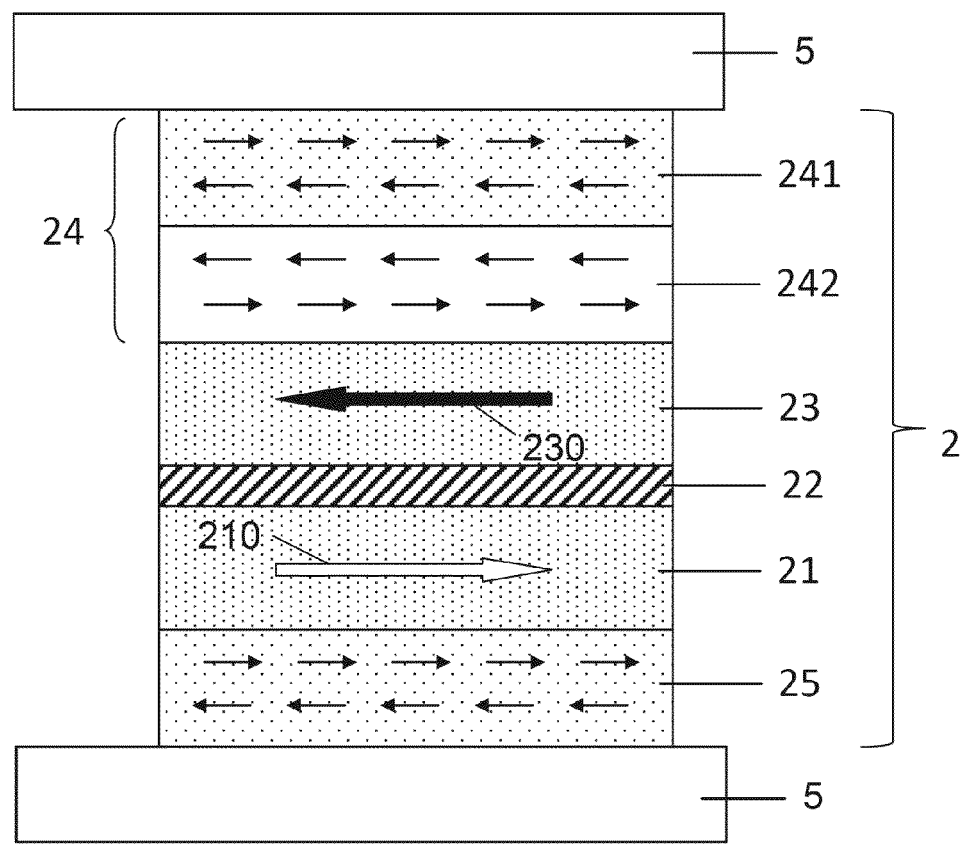
FIG. 1 represents a MRAM element comprising an antiferromagnetic storage layer according to an embodiment.

FIG. 1 represents a thermally assisted switching MRAM element 1 comprising a magnetic tunnel junction 2 according to an embodiment. The magnetic tunnel junction 2 comprises a reference layer 21 having a reference magnetization 210, a storage layer 23 having a storage magnetization 320, and a tunnel barrier layer 22 included between the storage layer 23 and the reference layer 21. The ferromagnetic reference and storage layers 21, 23 typically comprise a transition metal-based alloy, such a Co, Fe, or Ni-based alloy. The tunnel barrier layer 22 is preferably made of a material selected from the group comprising $Al_2O_3$ or MgO. The tunneling resistance of the magnetic tunnel junction 2 depends exponentially on the thickness of the tunnel barrier layer 22 and is measured by the resistance-area product (RA) of the magnetic tunnel junction 2. The RA must sufficiently small in order to flow a heating current 31 through the magnetic tunnel junction 2 which is sufficiently high to raise the temperature of the antiferromagnetic storage layer 24 at the high threshold temperature. The magnetic tunnel junction 2 further comprises an antiferromagnetic storage layer 24 exchange-coupling the storage layer 23 such as to pin the storage magnetization 230 of the storage layer 23 at a low temperature threshold, and to free it at a high temperature threshold. The MRAM element 1 can further comprise an electrode/conductive line 5 on each end of the magnetic tunnel junction 2 for passing a current in the magnetic tunnel junction 2.

Figure 2:
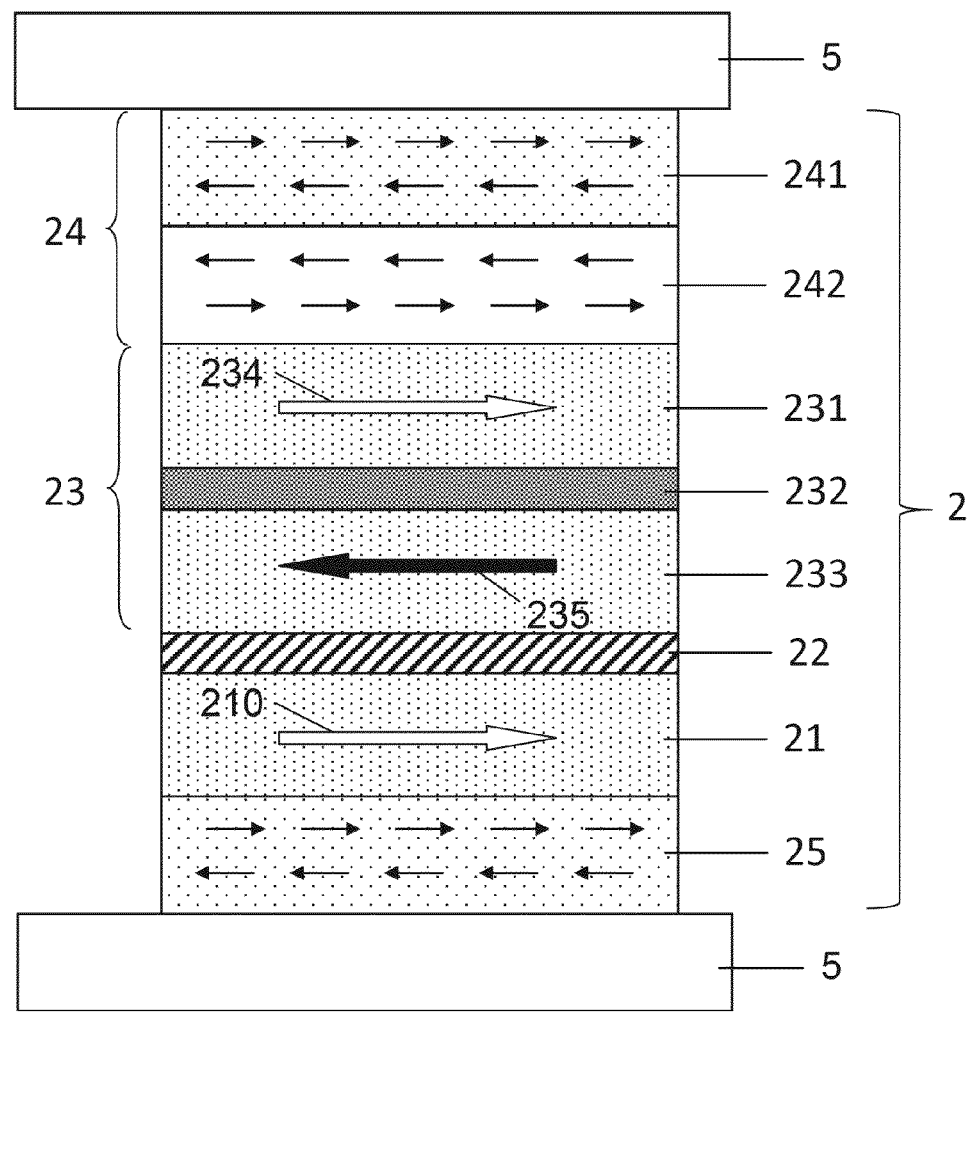
FIG. 2 shows the MRAM element according to another embodiment.

FIG. 2 shows the MRAM element 1 in another configuration wherein the storage layer 23 comprises a synthetic storage layer including a first storage ferromagnetic layer 231 having a first storage magnetization 234, a second ferromagnetic layer 233 having a second storage magnetization 235, and a non-magnetic coupling layer 232 separating the first and second ferromagnetic layers 231, 233. The dimensions (e.g., thickness) of the spacer layer 232 may be selected to cause the first and second storage layers 231 and 233 to be magnetically coupled via RKKY coupling, such that the first ferromagnetic magnetization 235 is oriented anti-parallel with the second ferromagnetic magnetization 235. The thickness may depend on the material that the spacer layer 232 is formed from. For example, the spacer layer 232 can comprise a non-magnetic material selected from the group comprising, for example, ruthenium (Ru), rhenium (Re), rhodium (Rh), tellurium (Te), yttrium (Y), chromium (Cr), iridium (Ir), silver (Ag), copper (Cu), etc. In an embodiment, the thickness may be comprised between about 0.2 nm and 3 nm. However, other thicknesses may be suitable to couple the two storage layers 231 and 233. The spacer layer 232 can preferably comprise ruthenium (Ru) and have a thickness being comprised between 0.7 nm and 0.9 nm. In the particular example of FIG. 2, the antiferromagnetic storage layer 24 is arranged such as to pin the storage magnetization 234 of the first storage layer 231 at the low temperature threshold, and to free it at the high temperature threshold.

Typically, the high threshold temperature, corresponding to a writing mode operating temperature, can range from 150° C. up to 250° C. This temperature range is determined in part by the fact that the high threshold temperature should be higher than the highest temperature to which a MRAM device, comprising a plurality of the MRAM element 1, is submitted during its normal use. For example, in extreme environments such as in spatial, military, automotive applications, local ambient temperatures in the vicinity of the MRAM device can be as high as 200° C. Preferably, the antiferromagnetic storage layer 24 has a storage blocking temperature $T_{bs}$ that is comprised between 150° C. and 250° C.

Mn-based metallic alloys are advantageous for antiferromagnetic layers since they combine a large enough exchange field at drive operating temperatures, are highly resistive such as to induce minimum current shunting, they require only low processing temperatures, are corrosion resistant, and they are thermally stable. FeMn-based antiferromagnetic layers allow for a relatively low writing mode operating temperature due to its low Néel temperature. Reference 1: Nozières et. al., "Blocking temperature distribution and long-term stability of spin-valve structures with Mn-based antiferromagnets"; J. Appl. Phys. 87, 3920 (2000), reports a blocking temperature value of about 170° C. for a FeMn layer, 10 nm in thickness.

On the other hand, other Mn-based antiferromagnetic alloys, in particular NiMn, PtMn and IrMn-based alloys have a better data retention of the data written in the storage layer 23 than the FeMn-based layer but are also characterized by high writing mode operating temperatures. Reference 1 reports a blocking temperature of about 255° C. for an IrMn layer 7.5 nm in thickness; of about 310° C. for a PtMn layer 35 nm in thickness; and above 400° C. for a NiMn layer 25 nm in thickness. Antiferromagnetic layers comprising NiMn, PtMn and IrMn thus allow enhancing data retention capability at the cost of a much higher writing mode operating temperature.

In the embodiment represented in FIGS. 1 and 2, the antiferromagnetic storage layer 24 includes a bilayer structure comprising a first antiferromagnetic layer 241 having a first storage blocking temperature $T_{bs1}$, and a second antiferromagnetic layer 242 having a second storage blocking temperature $T_{bs2}$. The first and second antiferromagnetic layers 241, 242 can be arranged such that the first storage blocking temperature $T_{bs1}$ is lower than the second storage blocking temperature $T_{bs2}$. For example, the first and second antiferromagnetic layers 241, 242 can be arranged such that the first storage blocking temperature $T_{bs1}$ is below 200° C. and the second blocking temperature $T_{bs2}$ is above 250° C.

In an embodiment, the first antiferromagnetic layer 241 comprises a FeMn-based ferromagnetic alloy. As discussed above, the FeMn-based alloy is characterized by a relatively low Néel temperature and low first storage blocking temperature $T_{bs1}$. Preferably, the first antiferromagnetic layer 241 comprising the FeMn-based ferromagnetic alloy is adjacent with the storage layer 23.

In another embodiment, the second antiferromagnetic layer 242 comprises a Mn-based alloy having a second storage blocking temperature being above 250° C. In particular, the second antiferromagnetic layer 242 can comprise a Mn-based alloy selected from IrMn, PtMn or NiMn. Preferably, the second layer 242 can comprise a NiMn-based alloy such that the difference between the values of the first and second storage blocking temperature $T_{bs1}$, $T_{bs2}$ is largest.

In yet another embodiment, the thickness of the first layer 241 and the thickness of the second layer 242 are selected such that the storage blocking temperature $T_{bs}$ of the antiferromagnetic storage layer 24 is comprised between 150° C. and 300° C.

Figure 3:
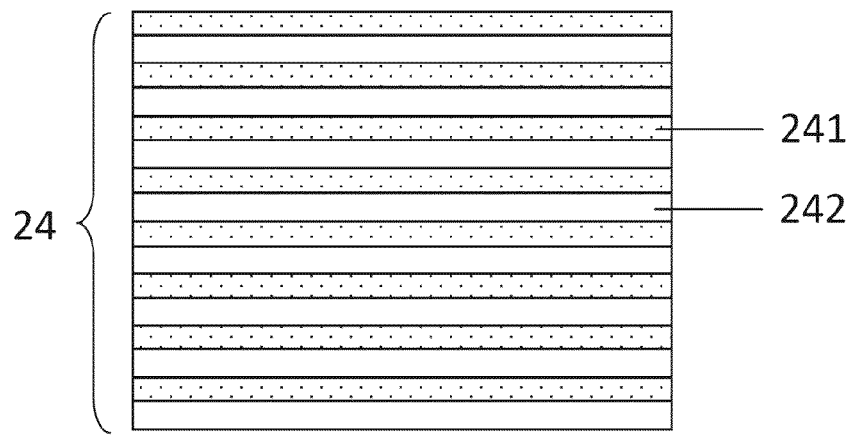
FIG. 3 illustrates the antiferromagnetic storage layer 4 comprising a multilayer structure, according to an embodiment.

In yet another embodiment, the antiferromagnetic storage layer 24 comprises a multilayer structure including a plurality of the first antiferromagnetic layer 241 and a plurality of the second antiferromagnetic layer 242. An example of the antiferromagnetic storage layer 24 comprising such multilayer structure represented in FIG. 3 wherein each of said plurality of the first antiferromagnetic layer 241 alternates with each of said plurality of the second antiferromagnetic layers 242.

In the case the first and second antiferromagnetic layer 241, 242 of the multi-layered antiferromagnetic storage layer 24 are thin, i.e., having a thickness of 1 nm and below, the two antiferromagnetic layers 241, 242 behave as one antiferromagnetic storage layer 24 having an intermediate value of the storage blocking temperature $T_{bs}$ between the low storage blocking temperature of the FeMn-based first antiferromagnetic layer 241 and the high storage blocking temperature of the other Mn-based second antiferromagnetic layer 242. Indeed, during post-deposition annealing of the layers 241, 242, the composition of the two layers 241, 242 intermix forming an alloy comprising FeMn and IrMn. With increasing thickness of the two storage antiferromagnetic layers 241, 242, the intermixing occurs in an interfacial region between the two layers 241, 242 that becomes proportionally smaller than the bulk region of the layers 241, 242 where no intermixing occurs. Consequently, increasing the thickness of the layers 241, 242 results in a value of the storage blocking temperature $T_{bs}$ that approaches the first storage blocking temperature $T_{bs1}$ of the first storage antiferromagnetic layers 241 being made of FeMn. In this latter configuration, a magnetic coupling occurs between the first storage antiferromagnetic layer 241 and the second storage antiferromagnetic layer 242 below the first storage blocking temperature $T_{bs1}$.

At and above the first storage blocking temperature $T_{bs1}$, the magnetic coupling between the first storage antiferromagnetic layer 241 and the second storage antiferromagnetic layer 242 disappears and the storage antiferromagnetic layers 24 is no more exchange-coupled with the storage layer 23. The storage blocking temperature $T_{bs}$ of the antiferromagnetic storage layer 24 can thus be tuned by varying the composition and the thickness of each of the first and second antiferromagnetic layers 241, 242.

Similarly to the bilayer structure of the antiferromagnetic storage layer 24 as shown in the examples of FIGS. 1 and 2, each of said plurality of the first antiferromagnetic layer 241 can be magnetically coupled with each of said plurality of the second antiferromagnetic layer 242, and behave as one antiferromagnetic storage layer 24 having an averaged value of the storage blocking temperature $T_{bs}$. This happens when the operating temperature is below the first storage blocking temperature $T_{bs1}$ of said each of said plurality of the first antiferromagnetic layer 241, and below the second storage blocking temperature $T_{bs2}$ of said plurality of the second antiferromagnetic layer 242.

Similarly to the bilayer structure, the storage blocking temperature $T_{bs}$ can further be tuned by varying the composition of each of said plurality of the first and of the second antiferromagnetic layer 241, 242. The storage blocking temperature $T_{bs}$ can also be tuned by varying the thickness of each of said plurality of the first and of the second antiferromagnetic layer 241, 242.

In an embodiment, the thickness the first antiferromagnetic layer 241 is comprised between 0.1 nm and 1 nm, and the thickness of the second antiferromagnetic layer 242 is comprised between 0.1 nm and 5 nm. Preferably the thickness the first antiferromagnetic layer 241 is comprised between 0.5 nm and 5 nm, and the thickness of the second antiferromagnetic layer 242 is comprised between 0.5 nm and 5 nm. The total thickness of the antiferromagnetic storage layer 24 comprising the bilayer structure or the multilayer structure as described herein can be comprised between 5 nm and 50 nm but preferably between 5 nm and 10 nm.

Figure 4:
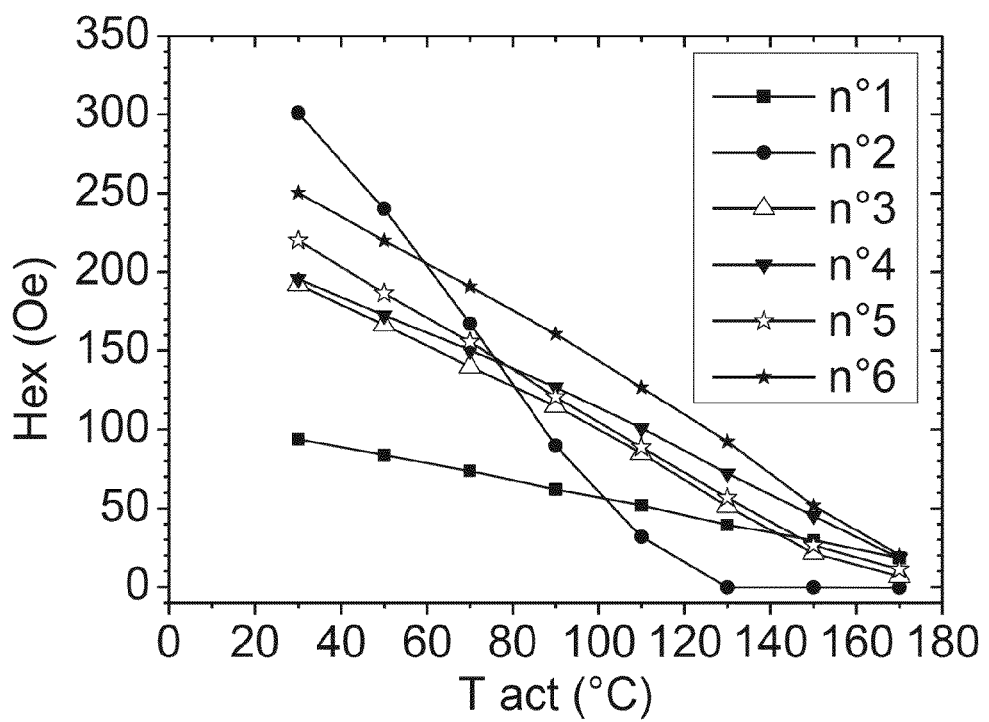
FIG. 4 reports the temperature dependence of exchange bias field for the antiferromagnetic storage layer, according to an embodiment.

The temperature dependence of exchange bias field (Hex) is reported in FIG. 4 for the antiferromagnetic storage layer 24 having the multilayer structure (curves 3 to 6). Here, the magnetic tunnel junction 2 further comprises a synthetic storage layer 23 wherein the 2 nm thick first storage ferromagnetic layer 231 comprises a CoFeB alloy, the 1.5 nm thick second ferromagnetic layer 233 comprises a NiFe alloy, and the 0.2 nm thick non-magnetic coupling layer 232 comprises Ta; a 2 nm thick reference layer 21 comprising a CoFeB alloy; and a tunnel barrier layer 22 made of MgO. FIG. 4 also reports the temperature dependence of the exchange bias field (Hex) for the antiferromagnetic storage layer 24 comprising a single layer including a FeMn alloy (curve 2), and an IrMn alloy (curve 1).

The exchange bias field (Hex) decreases substantially linearly with increasing temperature in all cases (curves 1 to 6). The exchange bias field (Hex) decreases faster for the antiferromagnetic storage layer 24 being made of the single FeMn layer (curve 2) than for the multi-layered antiferromagnetic storage layer 24 (curves 3 to 6). The antiferromagnetic storage layer 24 comprising the single IrMn layer (curve 1) has the lowest decreases in exchange bias field (Hex) with increasing temperature.

Curves 5 and 6 represent the case wherein one of the first antiferromagnetic storage layers 241 is in contact with the storage layer 23 (i.e. a sequence of alternating layers of FeMn/IrMn from the storage layer 23). Curves 3 and 4 represent the case wherein one of the second antiferromagnetic storage layers 242 is in contact with the storage layer 23 (i.e. a sequence of alternating layers of IrMn/FeMn from the storage layer 23). Moreover, curves 4 and 6 correspond to the antiferromagnetic storage layer 24 comprising ten of each first and second antiferromagnetic storage layers 241, 242, each layer 241, 242 being 0.5 nm in thickness. Curves 3 and 5 correspond to the antiferromagnetic storage layer 24 comprising five of each first and second antiferromagnetic storage layers 241, 242, each layer 241, 242 being 1 nm in thickness. As shown in FIG. 4, higher exchange bias field (Hex) is obtained when one of the antiferromagnetic storage layer 241 in contact with the storage layer 23 comprises the FeMn alloy (curves 5 and 6) than when it comprises the IrMn alloy (curves 3 and 4). Higher exchange bias field (Hex) is also obtained for the antiferromagnetic storage layer 24 comprising 0.5 nm thick antiferromagnetic storage layers 241, 242 (curves 4 and 6) than for the antiferromagnetic storage layer 24 comprising 1 nm thick antiferromagnetic storage layers 241, 242 (curves 3 and 5).

Figure 5:
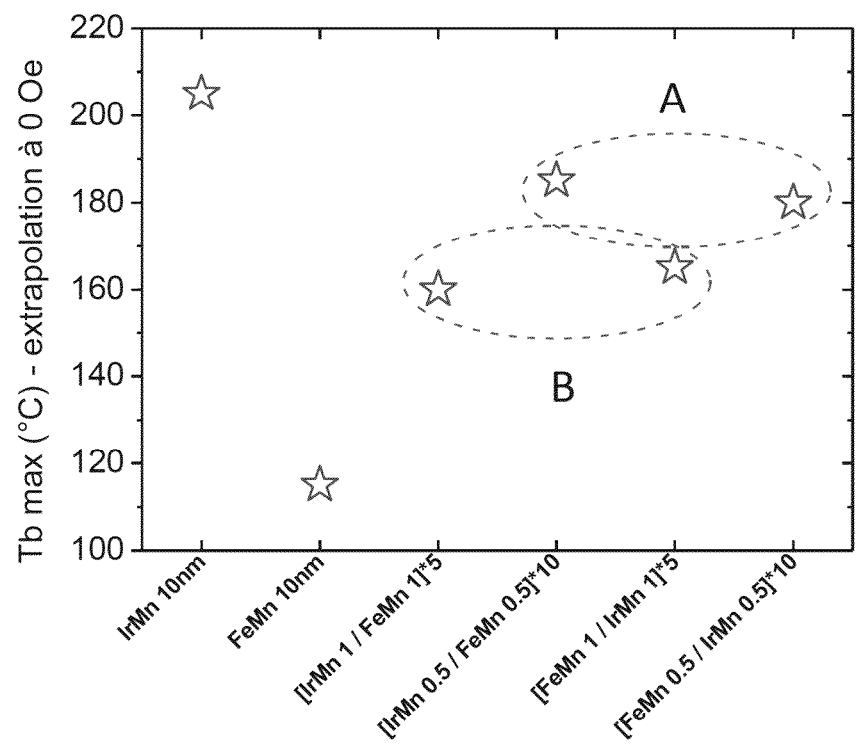
FIG. 5 reports the storage blocking temperature for the antiferromagnetic storage layer of FIG. 4.

FIG. 5 reports the storage blocking temperature $T_{bs}$ for the different configurations of the antiferromagnetic storage layer 24 of FIG. 4. The storage blocking temperature $T_{bs}$ is extrapolated at 0° C. from the curves 1 to 6. The highest storage blocking temperature $T_{bs}$ (about 205° C.) is obtained for the antiferromagnetic storage layer 24 having the single IrMn layer while the lowest storage blocking temperature $T_{bs}$ (about 115° C.) is obtained for the antiferromagnetic storage layer 24 having the single FeMn layer. The antiferromagnetic storage layer 24 comprising the multilayer structure with the 0.5 nm thick layers 241, 242 (data points denoted A in FIG. 5) yields higher storage blocking temperature $T_{bs}$, i.e., about 180° C. and 185° C. for the IrMn/FeMn sequence and the FeMn/IrMn sequence, respectively, than for the antiferromagnetic storage layer 24 comprising the multilayer structure with the 1 nm thick layers 241, 242 (data points denoted B in FIG. 5).

In yet another embodiment, the magnetic tunnel junction 2 further comprises an antiferromagnetic reference layer 25 exchange-coupling the reference layer 21 such as to pin the reference magnetization 210 below a reference blocking temperature $T_{br}$ of the antiferromagnetic reference layer 25. Here, the reference magnetization 210 should remain pinned in the whole range of operating temperatures of the MRAM cell in order to avoid losing data written in the reference layer 21. In particular, the reference magnetization 210 should thus remain pinned at the low and high temperature threshold. Moreover, the difference between the storage blocking temperature $T_{bs}$ of the antiferromagnetic storage layer 23 and the reference blocking temperature $T_{br}$ of the antiferromagnetic storage layer 23 should be larger than at least 50° C. in order to achieve a reliable MRAM device. A large difference between the storage and reference blocking temperature $T_{bs}$, $T_{br}$ can be obtained, for example, by the antiferromagnetic reference layer 25 being thick and comprising a NiMn-based alloy having a reference blocking temperature $T_{br}$ that is above 400° C. Alternatively, the antiferromagnetic reference layer 25 can also comprise a PtMn or IrMn-based alloy. The antiferromagnetic reference layer 25 can further comprise a bilayer structure or a multilayer structure comprising one or a plurality of antiferromagnetic reference layers 25.

An advantage of the antiferromagnetic storage layer 23 having the bilayer or multilayer structure as disclosed herein is that it combines better data retention, due to the high second storage blocking temperature $T_{bs2}$ of the second antiferromagnetic layer 242, with low writing mode operating temperatures, due to the low Néel temperature (or low first storage blocking temperature $T_{bs1}$) of the FeMn-based first antiferromagnetic storage layer 241.

REFERENCE NUMBERS

1 magnetic random access memory (MRAM) cell
2 magnetic tunnel junction
21 reference layer
210 reference magnetization
22 tunnel barrier layer
23 storage layer
230 storage magnetization
231 first storage ferromagnetic layer
232 spacer layer
233 second storage ferromagnetic layer
234 first storage magnetization
235 second storage magnetization
24 antiferromagnetic storage layer
241 first antiferromagnetic layer
242 second antiferromagnetic layer
5 electrode/conductive line
$T_{bs}$ storage blocking temperature
$T_{bs1}$ first storage blocking temperature
$T_{bs2}$ second storage blocking temperature
$T_{br}$ reference blocking temperature

The invention claimed is:

1. A thermally assisted switching MRAM element comprising a magnetic tunnel junction including a reference layer having a reference magnetization; a storage layer having a storage magnetization; a tunnel barrier layer included between the storage layer and the reference layer; and a storage antiferromagnetic layer exchange-coupling the storage layer such as to pin the storage magnetization at a low temperature threshold and to free it at a high temperature threshold;

the storage antiferromagnetic layer comprising at least one first antiferromagnetic layer having a first storage blocking temperature, and at least one second antiferromagnetic layer having a second storage blocking temperature;

the first storage blocking temperature being below 200° C. and the second storage blocking temperature being above 250° C.

2. MRAM element according to claim 1, wherein said at least one first antiferromagnetic layer comprises a FeMn-based alloy.

3. MRAM element according to claim 1, wherein said at least one second antiferromagnetic layer comprises a IrMn, PtMn or NiMn-based alloy.

4. MRAM element according to claim 1, wherein the storage antiferromagnetic layer comprises a plurality of the first antiferromagnetic layer and a plurality of the second antiferromagnetic layer, wherein each of said plurality of the first antiferromagnetic layer alternates with each of said plurality of the second antiferromagnetic layers.

5. MRAM element according to claim 4, wherein the first antiferromagnetic layer has a thickness comprised between 0.1 nm and 5 nm and the second antiferromagnetic layer has a thickness comprised between 0.1 nm and 5 nm.

6. MRAM element according to claim 4, wherein the first antiferromagnetic layer has a thickness comprised between 0.5 nm and 5 nm and the second antiferromagnetic layer has a thickness comprised between 0.5 nm and 5 nm.

7. MRAM element according to claim 1, wherein the storage antiferromagnetic layer has a thickness comprised between 5 nm and 50 nm, but preferably between 5 nm and 10 nm.

8. MRAM element according to claim 1, wherein said at least one first antiferromagnetic layer is in contact with the storage layer.

9. MRAM element according to claim 1, wherein the magnetic tunnel junction further comprises an antiferromagnetic reference layer exchange-coupling the reference layer such as to pin the reference magnetization below a reference blocking temperature of the antiferromagnetic reference layer.

10. MRAM device; comprising a plurality of MRAM elements, each MRAM element comprising a magnetic tunnel junction including a reference layer having a reference magnetization; a storage layer having a storage magnetization; a tunnel barrier layer included between the storage layer and the reference layer; and a storage antiferromagnetic layer exchange-coupling the storage layer such as to pin the storage magnetization at a low temperature threshold and to free it at a high temperature threshold;

the storage antiferromagnetic layer comprising at least one first antiferromagnetic layer having a first storage blocking temperature, and at least one second antiferromagnetic layer having a second storage blocking temperature;

the first storage blocking temperature being below 200° C. and the second storage blocking temperature being above 250° C.

\* \* \* \* \*